(12) United States Patent
Mizuno et al.

(10) Patent No.: US 8,253,325 B2
(45) Date of Patent: Aug. 28, 2012

(54) ORGANIC LIGHT-EMITTING DEVICE WITH MICROCAVITY STRUCTURE AND DIFFERING SEMI-TRANSPARENT LAYER MATERIALS

(75) Inventors: Nobutaka Mizuno, Tokyo (JP); Koichi Fukuda, Tokyo (JP)

(73) Assignee: Canon Kabushiki Kaisha, Tokyo (JP)

( * ) Notice: Subject to any disclaimer, the term of this patent is extended or adjusted under 35 U.S.C. 154(b) by 0 days.

(21) Appl. No.: 12/909,343

(22) Filed: Oct. 21, 2010

(65) Prior Publication Data
US 2011/0031515 A1    Feb. 10, 2011

Related U.S. Application Data

(62) Division of application No. 11/848,630, filed on Aug. 31, 2007, now Pat. No. 7,843,123.

(30) Foreign Application Priority Data

Sep. 7, 2006 (JP) ................................ 2006-242243
Aug. 20, 2007 (JP) ................................ 2007-213393

(51) Int. Cl.
*H01L 51/54* (2006.01)
(52) U.S. Cl. ........................................ 313/504; 313/503
(58) Field of Classification Search .................. 313/503, 313/504
See application file for complete search history.

(56) References Cited

U.S. PATENT DOCUMENTS

| | | | |
|---|---|---|---|
| 6,329,084 B1 * | 12/2001 | Tamano et al. | 428/690 |
| 7,102,282 B1 | 9/2006 | Yamada et al. | 313/506 |
| 7,218,049 B2 | 5/2007 | Yamada et al. | 313/506 |
| 7,510,455 B2 | 3/2009 | Suzuki | |
| 7,903,055 B2 | 3/2011 | Nishikawa et al. | |
| 2004/0077250 A1 | 4/2004 | Miyadera et al. | 445/24 |
| 2005/0142976 A1 | 6/2005 | Suzuki | |
| 2005/0269947 A1 | 12/2005 | Kobayashi | |

(Continued)

FOREIGN PATENT DOCUMENTS

JP    2004-127794    4/2004

(Continued)

OTHER PUBLICATIONS

Peng et al., "High-efficiency Microcavity Top-emitting Organic Light-emitting Diodes Using Silver Anode," *Appl. Phys. Lett.*, vol. 88, 073517, 1-3 (2006).

(Continued)

*Primary Examiner* — Nimeshkumar Patel
*Assistant Examiner* — Steven Horikoshi
(74) *Attorney, Agent, or Firm* — Fitzpatrick, Cella, Harper & Scinto (57) ABSTRACT

The organic light-emitting device of the present invention includes a plurality of organic light-emitting elements including an organic light-emitting element showing a first emission color and at least one organic light-emitting element showing a different emission color from the first emission color, each of the organic light-emitting elements including: a first electrode having a reflective surface; a second electrode placed on a light extraction side and including a semi-transparent layer; an organic compound layer including a light-emitting layer and formed between the first electrode and the second electrode; and a micro cavity structure for resonating light emitted from the light-emitting layer between the reflective surface and the semi-transparent layer, wherein the semi-transparent layer in the organic light-emitting element showing the first emission color is different in thickness and/or material from the semi-transparent layer in the at least one organic light-emitting element showing the different emission colors.

6 Claims, 5 Drawing Sheets

U.S. PATENT DOCUMENTS

| | | |
|---|---|---|
| 2006/0175966 A1 | 8/2006 | Yamada et al. ............... 313/506 |
| 2007/0257609 A1 | 11/2007 | Fukuda et al. ................ 313/506 |
| 2007/0279291 A1* | 12/2007 | Tsai et al. ............. 343/700 MS |
| 2008/0024402 A1 | 1/2008 | Nishikawa et al. |
| 2008/0054797 A1* | 3/2008 | Furugori ....................... 313/504 |

FOREIGN PATENT DOCUMENTS

| | | |
|---|---|---|
| JP | 2005-197010 A | 7/2005 |
| JP | 2005-347073 A | 12/2005 |
| WO | WO 01/39554 A1 | 5/2001 |
| WO | 2005/107327 A | 11/2005 |

OTHER PUBLICATIONS

Neyts et al., "Semitransparent Metal or Distributed Bragg Reflector for Wide-Viewing-Angle Organic Light-Emitting-Diode Micocavities," Jan. 2000, *J. Opt. Soc. Am. B*, vol. 17, No. 1, pp. 114-119.

Japanese Office Action issued in corresponding application No. 2007-213393 dated Dec. 20, 2011—6 pages with English translation thereof.

\* cited by examiner

ORGANIC LIGHT-EMITTING DEVICE WITH MICROCAVITY STRUCTURE AND DIFFERING SEMI-TRANSPARENT LAYER MATERIALS

CROSS-REFERENCE TO RELATED APPLICATIONS

This application is a division of application Ser. No. 11/848,630, filed Aug. 31, 2007, which claims the benefit of Japanese Patent Application Nos. 2006-242243, filed Sep. 7, 2006, and 2007-213393, filed Aug. 20, 2007. All prior applications are incorporated by reference herein in their entirety.

BACKGROUND OF THE INVENTION

1. Field of the Invention

The present invention relates to an organic light-emitting device provided with a plurality of organic light-emitting elements different from each other in emission color.

2. Description of the Related Art

Organic light-emitting elements (organic electroluminescence elements) have been actively researched and developed these days. An organic light-emitting element involves the following problems: the securement of a color purity and an improvement in luminous efficiency. One known solution to the problems is a micro cavity structure in which an electrode on a light extraction side is made semi-transparent so that light emitted from a light-emitting layer is resonated between both electrodes.

For example, International Patent Publication No. WO 01/039554 discloses a display device in which a light-emitting layer is interposed between a first electrode formed of a light reflection material and a second electrode formed of a transparent material; and at least one of the second electrode and the light-emitting layer has a resonating portion for resonating light emitted from the light-emitting layer. The device is formed so that an optical path L of the resonating portion has the positive minimum value satisfying the following Equation 2:

$$(2L)/\lambda + \Phi/(2\pi) = m \quad \text{Equation 2}$$

where m represents an integer; L represents the optical path of the resonating portion; Φ represents a phase shift produced upon reflection of light beams generated in the light-emitting layer on both ends of the resonating portion; and λ represents the peak wavelength of the spectrum of a light beam which is one desired to be extracted from the light beams generated in the light-emitting layer.

In addition, Japanese Patent Application Laid-Open No. 2004-127795 discloses that an optical path from a light emission center to each reflective layer is defined.

When semi-transparent layers (semi-transparent electrodes) formed in a plurality of organic light-emitting elements have the same thickness, the semi-transparent layers of the respective organic light-emitting elements are different from each other in transmittance and reflectance owing to the wavelength dispersibility of a material for each semi-transparent layer, so that the respective organic light-emitting elements are different from each other in intensity of resonance. Accordingly, an organic light-emitting element having a relatively low intensity of resonance involves a problem that the luminous efficiency of the element cannot be sufficiently improved. In addition, an organic light-emitting device has a serious problem of a chromaticity difference due to a view angle, and the more intense the resonance, the larger a view angle difference.

SUMMARY OF THE INVENTION

The present invention has been made in the light of the above-mentioned problems, and provides an organic light-emitting device in which, while a chromaticity difference due to the view angle of an organic light-emitting element is suppressed, resonance is intensified so that an improvement in entire luminous efficiency can be achieved.

In addition, the present invention provides an organic light-emitting device having characteristics with less fluctuation in production thereof.

In order to the problems of the prior art, the organic light-emitting device of the present invention includes a plurality of organic light-emitting elements including an organic light-emitting element showing a first emission color and at least one organic light-emitting element showing a different emission color from the first emission color, each of the organic light-emitting elements including: a first electrode having a reflective surface; a second electrode placed on a light extraction side and including a semi-transparent layer; an organic compound layer including a light-emitting layer and formed between the first electrode and the second electrode; and a micro cavity structure for resonating light emitted from the light-emitting layer between the reflective surface and the semi-transparent layer, wherein a thickness of the semi-transparent layer in the organic light-emitting element showing the first emission color is different from a thickness of the semi-transparent layer in the at least one organic light-emitting element showing the different emission color.

The organic light-emitting device of the present invention includes a plurality of organic light-emitting elements including an organic light-emitting element showing a first emission color and at least one organic light-emitting element showing a different emission color from the first emission color, each of the organic light-emitting elements including: a first electrode having a reflective surface; a second electrode placed on a light extraction side and including a semi-transparent layer; an organic compound layer including a light-emitting layer and formed between the first electrode and the second electrode; and a micro cavity structure for resonating light emitted from the light-emitting layer between the reflective surface and the semi-transparent layer, wherein a material of the semi-transparent layer in the organic light-emitting element showing the first emission color is different from a material of the semi-transparent layer in the at least one organic light-emitting element showing the different emission color.

According to the present invention, an organic light-emitting element can be provided with an optimum micro cavity structure. As a result, while a chromaticity difference due to a view angle is suppressed, resonance is intensified, and hence an improvement in entire luminous efficiency can be achieved.

In particular, when materials for the semi-transparent layers of all or a part of organic light-emitting elements are different from each other, a thickness between both electrodes of each of the organic light-emitting elements can be made large, so that robustness based on a thickness variation is improved. As a result, an organic light-emitting device having characteristics with less fluctuation in production thereof can be provided.

Further features of the present invention will become apparent from the following description of exemplary embodiments with reference to the attached drawings.

DESCRIPTION OF THE EMBODIMENTS

The intensity of resonance in an organic light-emitting element having a micro cavity structure is known to depend on the reflectance and transmittance of the semi-transparent layer of the element.

For example, Applied Physics Letters 88, 073517 (2006): "High-efficiency microcavity top-emitting organic light-emitting diodes using silver anode" discloses, as an equation for representing the intensity of radiation, the following Equation 1:

$$I(\lambda) \propto \frac{|1 + \sqrt{R_1} \exp[j(4\pi n_0 z/\lambda + \phi_1)]|^2}{|1 - \sqrt{R_1 R_2} \exp[j(4\pi n_0 d/\lambda + \phi_1 + \phi_2)]|^2} T_2(\lambda) \quad \text{Equation 1}$$

In the equation, an organic light-emitting element including a first electrode (anode) having a reflective surface and a second electrode (cathode) having a semi-transparent layer is considered. $R_2$ and $T_2$ represent the reflectance and transmittance of the semi-transparent layer, respectively. $R_1$ represents the reflectance of the first electrode. $\phi_1$ and $\phi_2$ each represent a phase shift at each electrode. z represents a distance between a light-emitting position and the first electrode, and d represents a resonant wavelength. As can be seen from Equation 1, the intensity of radiation, that is, the intensity of resonance varies depending on values of the reflectance and transmittance of the semi-transparent layer.

Accordingly, when an organic light-emitting device provided with a plurality of organic light-emitting elements each having a micro cavity structure is considered, the adjustment of the intensity of resonance in each organic light-emitting element is an optimum action. In the present invention, an organic light-emitting device having high efficiency is obtained by optimizing the material and/or thickness of a semi-transparent layer in accordance with an emission color.

Figure 3:
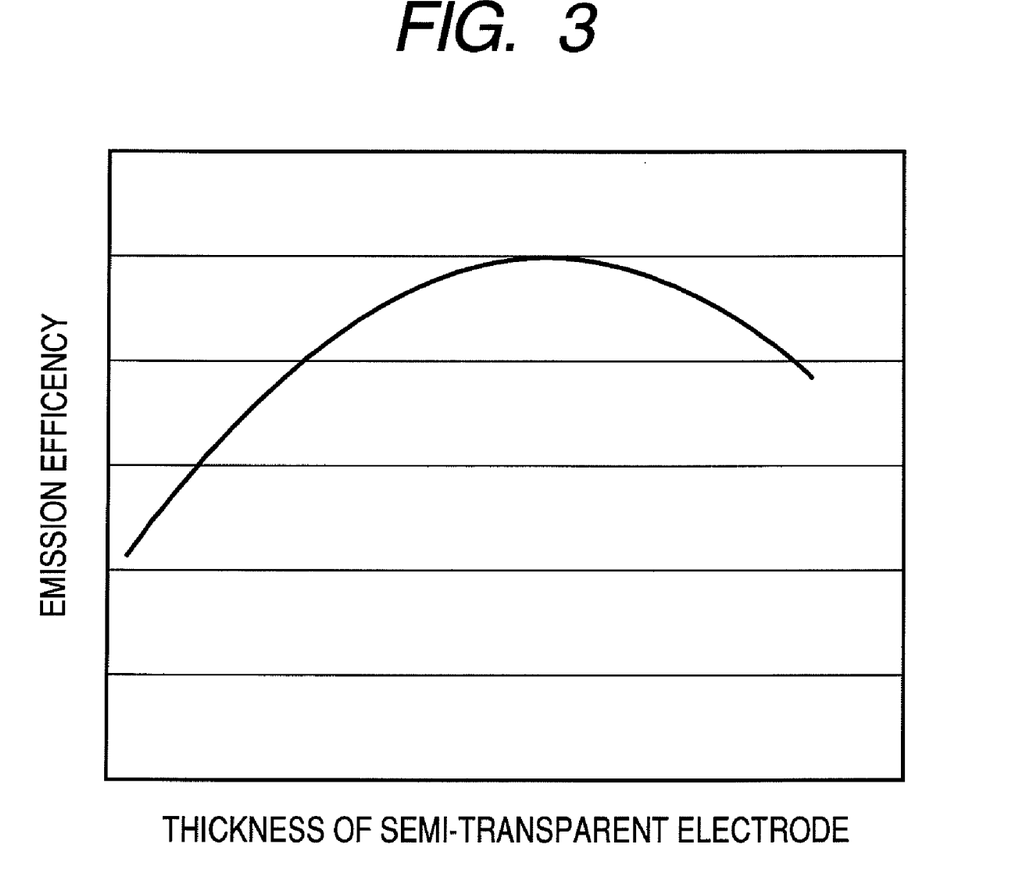
FIG. 3 is a graph showing a relationship between the luminous efficiency of an organic light-emitting element and the thickness of the semi-transparent electrode of the element.

Here, such upward convex relationship as shown in FIG. 3 is observed between the luminous efficiency of an organic light-emitting element and the thickness of the semi-transparent layer of the element. That is, increasing the thickness of the semi-transparent layer increases the luminous efficiency because the reflectance of the layer increases. However, excessively increasing the thickness of the semi-transparent layer reduces the luminous efficiency because the amount of light to be absorbed on the semi-transparent layer increases.

Although an optimum thickness that provides the maximum value for the luminous efficiency varies depending on a material for the semi-transparent layer and the emission wavelength of the organic light-emitting element, a relative comparison between respective color-light-emitting elements shows that the longer the emission wavelength of an organic light-emitting element, the larger the optimum thickness.

However, investigation conducted by the inventors of the present invention has shown that the intensity of resonance of an organic light-emitting element does not completely follow Equation 1 when the optical constant of the semi-transparent layer of the element is set to a value in the case of a bulk. An example of a possible reason for the foregoing is that the optical constant of the semi-transparent layer is different from the value in the case of the bulk. However, the fact that the intensity of resonance does not completely follow Equation 1 does not hinder the present invention.

First Embodiment

Figure 1:
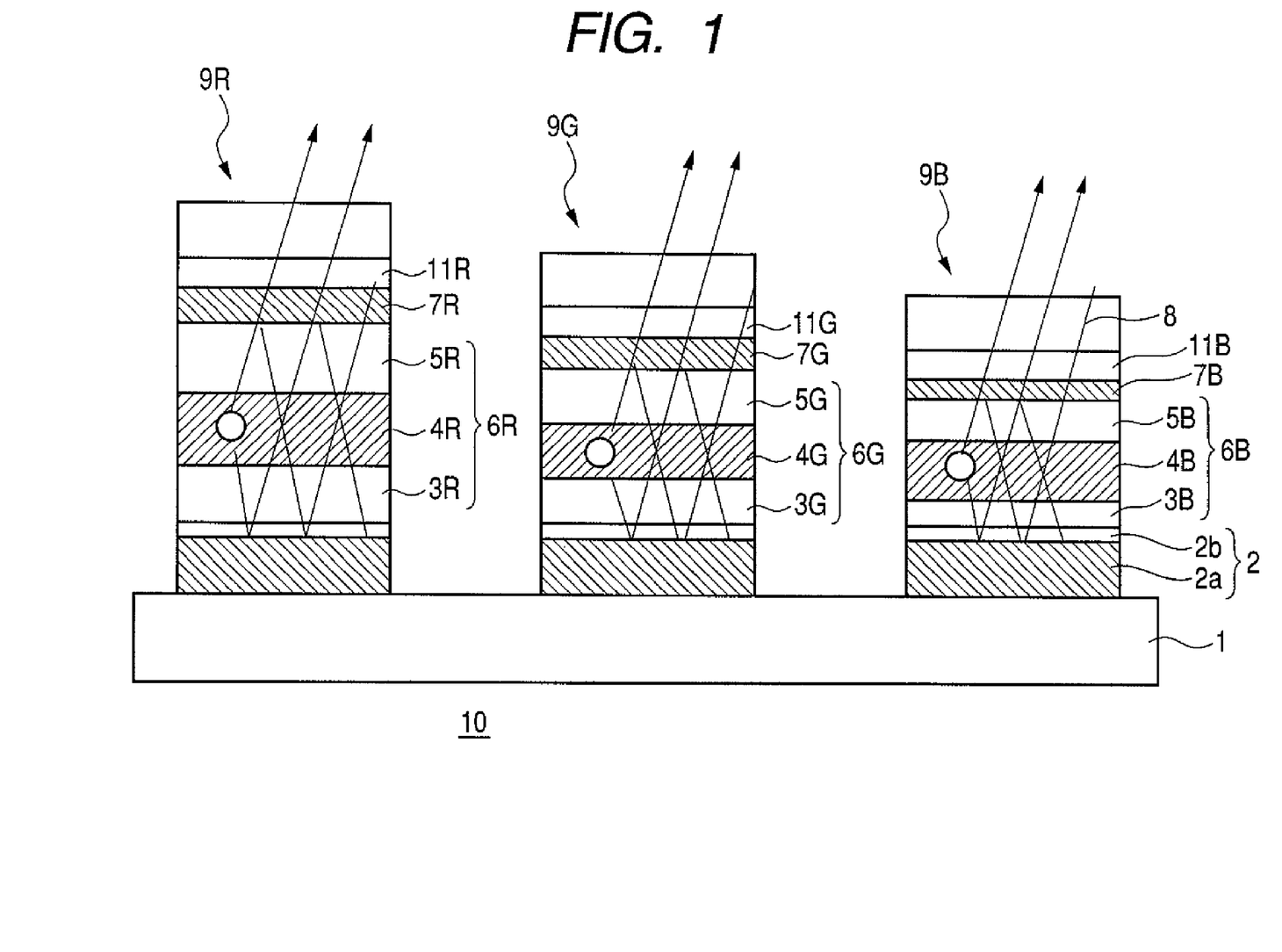
FIG. 1 is a partially enlarged sectional view illustrating an organic light-emitting device according to the present invention.

FIG. 1 is a partially enlarged sectional view illustrating an example of the constitution of an organic light-emitting device according to the present invention.

An organic light-emitting device 10 shown in FIG. 1 is an organic light-emitting device having organic light-emitting elements 9R, 9G and 9B showing red (R), green (G) and blue (B) emission colors, respectively, and all organic light-emitting elements each have a micro cavity structure.

Each of the organic light-emitting elements 9R, 9G and 9B has such a constitution that a first electrode 2 having a reflective surface as an anode, a hole transport layer 3R, 3G or 3B, a light-emitting layer 4R, 4G or 4B, and an electron transport layer 5R, 5G or 5B as an organic compound layer 6R, 6G or 6B, a semi-transparent layer 7R, 7G or 7B as a cathode, a transparent conductive layer 11R, 11G or 11B, and a protective layer 8 are sequentially provided on a substrate 1. The organic light-emitting device is of a top emission type constitution in which, when a current is caused to flow in each of the organic light-emitting elements, a hole injected from the anode of each element and an electron injected from the cathode of the element are recombined in the light-emitting layer 4R, 4G or 4B, so that red light, green light, and blue light can be extracted from a cathode side.

A material having a large work function is used in the first electrode 2 in order that a hole may be efficiently injected. To be specific, the first electrode 2 is formed of a transparent, conductive metal oxide layer 2b made of, for example, ITO or IZO, and a metal layer 2a having a high reflectance made of, for example, chromium, silver, platinum, aluminum, or an alloy containing any one of them is desirably formed below the layer 2b. When the metal layer 2a is formed, a boundary surface between the metal layer 2a and the conductive metal oxide layer 2b corresponds to the lower reflective surface of the micro cavity structure.

A metal thin film or the like having a small work function is suitable for the semi-transparent layers 7R, 7G and 7B. Specific examples of a material for the layer include: metals such as aluminum, calcium, magnesium, silver, and gold; an alloy of any one of these metals and a lithium metal or the like; and an alloy of magnesium and silver. The examples further include alloys of those metals. An alloy is suitably used as a material for the semi-transparent layer because the alloy is highly resistant to physical deterioration and chemical deterioration.

In this embodiment, the metal layer 2a of the first electrode, and the semi-transparent layers 7R, 7G and 7B as the second electrode are each formed of a silver film. The thickness of a silver film for the semi-transparent layer 7R is 30 nm. The thickness of a silver film for the semi-transparent layer 7G is 25 nm. The thickness of a silver film for the semi-transparent layer 7B is 15 nm. That is, the longer the emission wavelength of an organic light-emitting element, the larger the thickness of the semi-transparent layer of the element. The thickness of the semi-transparent layers 7R, 7G and 7B of each organic light-emitting element is changed in order that the element may have the maximum luminous efficiency [cd/A].

Each of the hole transport layers 3R, 3G and 3B, the light-emitting layers 4R, 4G and 4B, and the electron transport layers 5R, 5G and 5B (and an electron injection layer (not shown)) interposed between the pair of electrodes 2 and 7R, 7G or 7B may be formed of a low weight molecule material, may be formed of a polymer material, or may be formed of both the materials, and a material for each of the layers is not particularly limited. A conventionally known material can be used in each of the layers as required.

A desired hole-injection transporting material has excellent mobility for facilitating injection of a hole from an anode and for transporting the injected hole to a light-emitting layer 4. The injection layer may be interposed between the anode 2 and the hole transport layer 3R, 3G, or 3B. Examples of a low molecular weight or polymer material having hole-injection transporting property include, but are not limited to: a triarylamine derivative; a phenylenediamine derivative; a triazole derivative; an oxadiazole derivative; an imidazole derivative; a pyrazoline derivative; a pyrazolone derivative; an oxazole derivative; a fluorenone derivative; a hydrazone derivative; a stilbene derivative; a phthalocyanine derivative; a porphyrin derivative; poly(vinylcarbazole); poly(silylene); poly(thiophene); and other conductive polymers. Part of specific examples of the material is shown below.

Low Weight Molecule-Based Hole Injection Transport Material:

(Chemical Formula 1)

TPD

α-NPD m-MTDATA

DTDPFL

Polymer-Based Hole Transport Material:

(Chemical Formula 2)

PVC$_z$  DPA-PS  TPA-PMMA

-continued

TPD-PMMA

TPD-PMAA

R: C6H13, C8H17, C12H25
Poly thiophene

Polysilane

TPD-PCA

A fluorescent dye or phosphorescent material having high luminous efficiency is used as a light-emitting material. Part of specific examples of the light-emitting material is shown below.

(Chemical Formula 3)

Coumarin 6

The electron transport material may be arbitrarily selected from materials which transports the injected electron into the light-emitting layer 4. The material is selected in consideration of, for example, the balance with the mobility of a carrier of the hole transport material. Examples of a material having electron-injection transporting property include, but are not limited to, an oxadiazole derivative, an oxazole derivative, a thiazole derivative, a thiadiazole derivative, a pyrazine derivative, a triazole derivative, a triazine derivative, a perylene derivative, a quinoline derivative, a quinoxaline derivative, a fluorenone derivative, an anthrone derivative, a phenanthroline derivative, and an organometallic complex. Part of specific examples of the material is shown below.

(Chemical Formula 4)

TAZ

Bphen

Alq3

Any one of the above-mentioned electron transportable materials is caused to contain 0.1 percent to several tens of percent of an alkali metal or an alkaline earth metal, or a compound of any such metal, whereby electron-injecting property can be imparted to the material, and the material can serve as an electron injection material. An electron injection layer is not an indispensable layer, but, in consideration of damage upon subsequent formation of the semi-transparent layers 7R, 7G and 7B, an electron injection layer having a thickness of about 10 to 100 nm is desirably inserted in order that good electron-injecting property may be secured.

In the organic light-emitting device according to the present invention, a thin film for the organic compound layers 6R, 6G and 6B, is generally formed by a vacuum deposition method, an ionized evaporation method, sputtering, plasma, or a known coating method (such as a spin coating, dipping, casting, LB, or inkjet method) in which a compound is dissolved in an appropriate solvent. In film formation by a coating method, in particular, a film may be formed by using a compound in combination with an appropriate binder resin. The binder resin may be selected from a wide variety of binder resins. Examples of the binder resin include, but not limited to: a polyvinyl carbazole resin; a polycarbonate resin; a polyester resin; a polyallylate resin; a polystyrene resin; an ABS resin; a polybutadine resin; a polyurethane resin; an acrylic resin; a methacrylic resin; a butyral resin; a polyvinyl acetal resin; a polyamide resin; a polyimide resin; a polyethylene resin; a polyethersulfone resin; a diallyl phthalate resin; a phenol resin; an epoxy resin; a silicone resin; a polysulfone resin; and a urea resin. One kind of binder resin may be used alone, or two or more kinds thereof may be mixed and used as a copolymer. Further, an additive such as a known plasticizer, antioxidant, or ultraviolet absorber may be used in combination as required.

The protective layer 8 is provided for the purpose of preventing each organic light-emitting element from contacting with, for example, oxygen or moisture. Examples of the protective layer 8 include: a metal nitride film made of, for example, silicon nitride or silicon oxynitride; a metal oxide film made of, for example, tantalum oxide; and a diamond thin film. In addition, the examples include: a polymer film made of, for example, a fluorine resin, poly(p-xylene), polyethylene, a silicone resin, or a polystyrene resin; and a photocurable resin. In addition, each element itself can be covered with, for example, glass, a gas impermeable film, or a metal, and packaged with a proper sealing resin. In addition, a moisture absorbent may be incorporated into the protective layer 8 for improving the moisture resistance of the layer.

COMPARATIVE EXAMPLE 1

Figure 2:
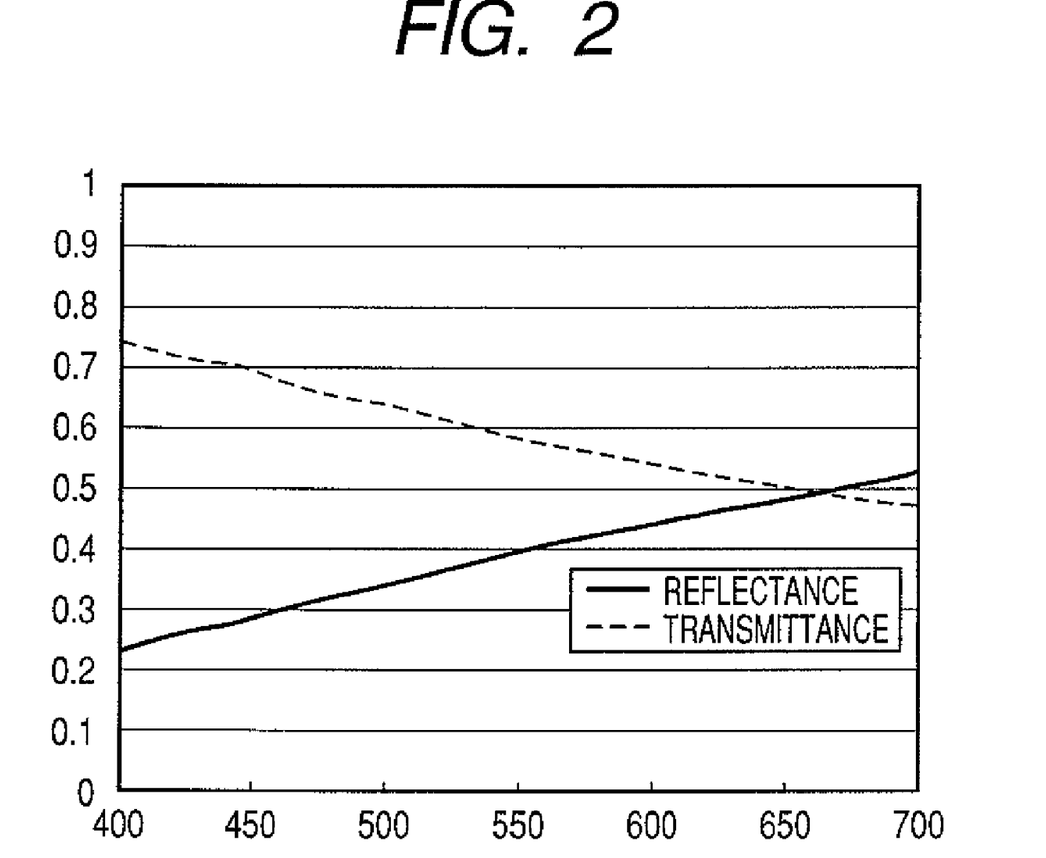
FIG. 2 is a graph showing the wavelength dispersibility of each of a transmittance and a reflectance.

An organic light-emitting device of Comparative Example 1 has such a constitution that the semi-transparent layers of all organic light-emitting elements have the same thickness, and a silver film having a thickness of 15 nm is used in each of the semi-transparent layers. The constitution of each of the organic light-emitting elements is the same as that of first Embodiment except for the semi-transparent layer of the element. FIG. 2 shows the reflectance and transmittance of an organic compound layer of Comparative Example 1; provided that a bulk value was used for the optical constant of silver.

When the semi-transparent layers of all organic light-emitting elements have the same thickness, the respective organic light-emitting elements are different from each other in intensity of resonance because the reflectance and transmittance of the semi-transparent layer of each of the organic light-emitting elements vary depending on the wavelength of light to be emitted from the element. Accordingly, all organic light-emitting elements do not have optimum resonance structures.

On the other hand, in first Embodiment, the semi-transparent layers of the respective organic light-emitting elements are different from each other in thickness, whereby resonance can be sufficiently intensified in each of all organic light-emitting elements.

Table 1 shows the efficiency (cd/A) and CIE chromaticity coordinates of each organic light-emitting element in each of first Embodiment and Comparative Example 1; provided that the efficiency is normalized.

TABLE 1

| | R | | G | | B | |
|---|---|---|---|---|---|---|
| | Efficiency (cd/A) | Chromaticity coordinates | Efficiency (cd/A) | Chromaticity coordinates | Efficiency (cd/A) | Chromaticity coordinates |
| Comparative Example 1 | 1.00 | (0.654, 0.344) | 1.00 | (0.265, 0.654) | 1.00 | (0.12, 0.10) |
| First Embodiment | 1.22 | (0.662, 0.337) | 1.39 | (0.242, 0.705) | 1.00 | (0.12, 0.10) |

Figure 4:
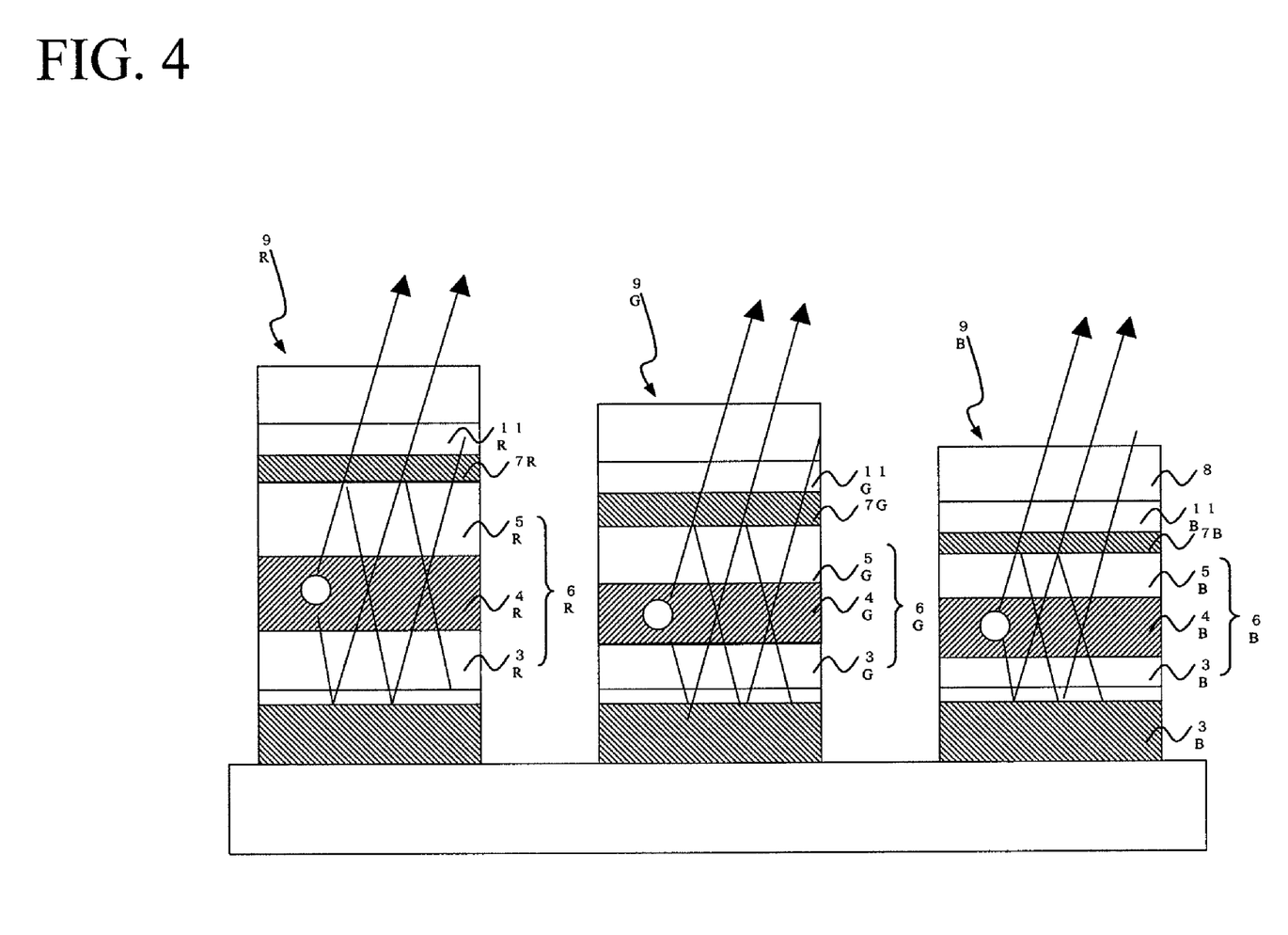
FIG. 4 is a partially enlarged sectional view illustrating an organic light-emitting device according to an embodiment of the present invention.

The organic R and G light-emitting elements of first Embodiment each have a luminous efficiency higher than that of each of the organic R and G light-emitting elements of Comparative Example 1 while the organic R and G light-emitting elements of first Embodiment each show a color having a deep purity. As a matter of course, a power consumption upon constitution of an organic light-emitting device in first Embodiment is lower than that in Comparative Example 1. In addition, the lifetime of an organic light-emitting element depends on a current density, so that an increase in lifetime, and a reduction in power consumption, of an organic light-emitting element can be achieved in first Embodiment.

device is considered to be a display device, not only luminous efficiency but also a view angle characteristic is extremely important. In general, the view angle characteristic of an organic light-emitting element using a micro cavity structure deteriorates as resonance is intensified. To be specific, as the semi-transparent layer of the element is made thicker, a chromaticity difference due to a view angle becomes larger. In view of the foregoing, in this embodiment, an organic light-emitting device taking not only luminous efficiency but also a view angle characteristic in consideration is provided. Incidentally, this embodiment is shown in FIG. 4, wherein like numerals are employed to denote elements similar to those shown in the first embodiment.

In order to obtain a good view angle characteristic, in all organic light-emitting elements on an organic light-emitting device, a chromaticity difference at a view angle of 45° or less with respect to a front surface thereof satisfies the relationship of $\Delta u'v' < 0.025$ where $\Delta u'v'$ represents a distance between chromaticity coordinates observed from a front surface and chromaticity coordinates observed obliquely in a u' v' chromaticity diagram.

In first Embodiment, the organic G and B light-emitting elements each satisfied the above view angle characteristic, but the organic R light-emitting element did not satisfy the above view angle characteristic. In view of the foregoing, the constitution of this embodiment is the same as that of first Embodiment except that the thickness of the semi-transparent layer 7R of the organic R light-emitting element is set to 20 nm. As a result, all organic light-emitting elements on the organic light-emitting device in this embodiment each satisfy the above view angle characteristic.

In addition, Table 2 shows the efficiency (cd/A) and CIE chromaticity coordinates of each organic light-emitting element in each of this embodiment and Comparative Example 1; provided that the efficiency is normalized.

TABLE 2

| | R | | G | | B | |
|---|---|---|---|---|---|---|
| | Efficiency (cd/A) | Chromaticity coordinates | Efficiency (cd/A) | Chromaticity coordinates | Efficiency (cd/A) | Chromaticity coordinates |
| Comparative Example 1 | 1.00 | (0.654, 0.344) | 1.00 | (0.265, 0.654) | 1.00 | (0.12, 0.10) |
| Second Embodiment | 1.22 | (0.662, 0.337) | 1.39 | (0.242, 0.705) | 1.00 | (0.12, 0.10) |

Second Embodiment

In first Embodiment, the thickness of the semi-transparent layers 7R, 7G and 7B was determined in order that an organic light-emitting element for each color might have the maximum efficiency. However, when an organic light-emitting The organic R and G light-emitting elements of second Embodiment each have a luminous efficiency higher than that of each of the organic R and G light-emitting elements of Comparative Example 1 while the organic R and G light-emitting elements of second Embodiment each show a color having a deep purity. As a matter of course, power consumption upon constitution of an organic light-emitting device in second Embodiment is lower than that in Comparative Example 1. In addition, the lifetime of an organic light-emitting element depends on a current density, so that an increase in lifetime, and a reduction in power consumption, of an organic light-emitting element can be achieved in second Embodiment. Further, in this embodiment, an organic light-emitting device having a good view angle characteristic can be obtained.

Third Embodiment

An organic light-emitting device of this embodiment has the same constitution as that of first Embodiment except that a material for the semi-transparent layer 7B of the organic B light-emitting element having the worst luminous efficiency is changed.

To be specific, both the semi-transparent layers 7R and 7G are each formed of a silver film having a thickness of 10 nm, and the semi-transparent layer 7B is formed of an aluminum film having a thickness of 10 nm.

COMPARATIVE EXAMPLE 2

An organic light-emitting device of Comparative Example 2 has such a constitution that the semi-transparent layers of all organic light-emitting elements are formed of silver films having the same thickness.

The characteristics of third Embodiment and Comparative Example 2 are compared with each other on the basis of a difference in thickness of the organic compound layer 6R, 6G or 6B.

In the case of an organic light-emitting element having a micro cavity structure, silver or an alloy mainly formed of silver is often used as a metal capable of reflecting visible light at a high reflectance in the semi-transparent layer of the element. However, when an interference condition corresponding to m=1 in Equation 2 is adopted in each of all organic light-emitting elements each having a micro cavity structure, an organic light-emitting element showing an emission color having a shorter wavelength has a shorter resonant wavelength. Accordingly, in the case of an organic light-emitting device formed of organic light-emitting elements for R, G, and B colors, the thicknesses of the organic compound layers 6R, 6G, and 6B can be arranged as follows: R>G>B. When the thickness of any such layer is small, the organic light-emitting device is largely affected by a thickness variation upon actual production of an organic light-emitting element. Specific potential problems due to the thickness variation include a reduction in color purity of an organic light-emitting element and the loss of the white balance of the organic light-emitting device. Accordingly, from the viewpoint of the robustness of the production of the organic light-emitting device, the thickness of each of the organic compound layers of all organic light-emitting elements is desirably equal to or larger than a certain value.

In third Embodiment, aluminum is used as a material for the semi-transparent layer 7B, so that the thickness of the organic compound layer 6B is larger than that in the case where silver is used as a material for the semi-transparent layer in consideration of a phase change.

Table 3 shows the thickness of each layer in each of third Embodiment and Comparative Example 2.

TABLE 3

| Comparative Example 2 | R | G | B | Third Embodiment | R | G | B |
|---|---|---|---|---|---|---|---|
| Semi-transparent Cathode | Ag | Ag 10 | Ag | Semi-transparent Cathode | Ag 10 | Ag | Al 10 |
| Organic layer | 90 | 65 | 45 | Organic layer | 90 | 65 | 62 |
| Planarizing film (IZO) | | 20 | | Planarizing film (IZO) | | 20 | |
| Anode Silver alloy | | 100 | | Anode Silver alloy | | 100 | |

As can be seen from Table 3, when aluminum is used in the semi-transparent layer 7B, the thickness of the organic compound layer of the organic B light-emitting element can be made larger than that in Comparative Example 2, so that robustness based on a thickness variation is improved. In addition, silver capable of reflecting visible light at a high reflectance is used in each of the semi-transparent layers 7R and 7G, so that a high resonance effect can be obtained, and an organic light-emitting device having a high luminous efficiency can be obtained.

Fourth Embodiment

Figure 5:
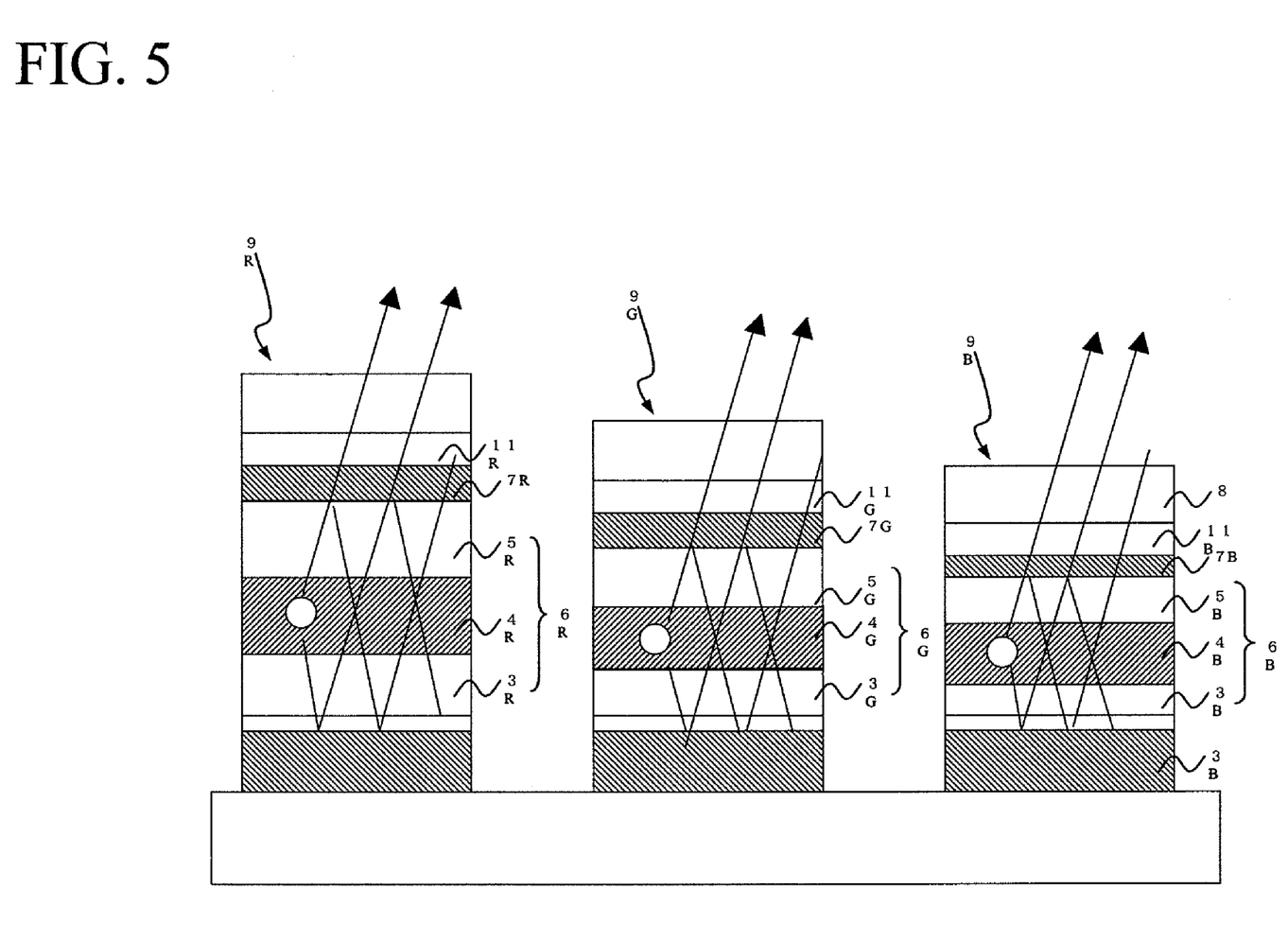
FIG. 5 is a partially enlarged sectional view illustrating an organic light-emitting device according to another embodiment of the present invention.

An organic light-emitting device of this embodiment has the same constitution as that of first Embodiment except that a thickness for the semi-transparent layer 7B of the organic B light-emitting element having the worst luminous efficiency is changed. Incidentally, this embodiment is shown in FIG. 5, wherein like numerals are employed to denote similar elements to those shown in the first embodiment.

To be specific, both the semi-transparent layers 7R and 7G are each formed of a silver film having a thickness of 25 nm, and the semi-transparent layer 7B is formed of a silver film having a thickness of 15 nm.

COMPARATIVE EXAMPLE 3

An organic light-emitting device of Comparative Example 3 has such a constitution that the semi-transparent layers of all organic light-emitting elements are formed of silver films having the same thickness.

To be specific, the semi-transparent layers of the organic R, G and B light-emitting elements are each formed of a silver film having a thickness of 15 nm or 25 nm.

When three color light beams, that is, a light beam having an R color, a light beam having a G color, and a light beam having a B color are emitted, the luminous efficiency of an organic light-emitting element varies depending on the color of a light beam to be emitted from the element. In view of the foregoing, the simplification of a process for the production of the organic light-emitting device, and an improvement in efficiency of an organic light-emitting element can be simultaneously achieved by adjusting the thickness of the semi-transparent layer of only an organic light-emitting element having the worst luminous efficiency. In third Embodiment, the thickness of the semi-transparent layer of only the organic B light-emitting element generally having the worst luminous efficiency is set to 15 nm, and the thickness of the semi-transparent layer of each of the organic R and G light-emitting elements is set to 25 nm. As far as the inventors of the present invention have examined, while the organic R and G light-emitting elements each had good efficiency when the thickness of each of the semi-transparent layers 7R and 7G was 25 nm, the organic B light-emitting element had good efficiency when the thickness of the semi-transparent layer 7B was 15 nm. In conventional cases, the semi-transparent layers of all organic light-emitting elements have been formed to have the same thickness; changing the thickness of the semi-transparent layer of only the organic B light-emitting element as in the case of third Embodiment can provide an organic light-emitting device in which all organic light-emitting elements each have high efficiency.

Table 4 shows a comparison between the efficiency of an organic R, G and B light-emitting elements when the thickness of the semi-transparent layer of the element is 15 nm and the efficiency of the element when the thickness of the semi-transparent layer is 25 nm.

TABLE 4

| Efficiency comparison | R | G | B |
|---|---|---|---|
| Ag 15 | 1.00 | 1.00 | 1.00 |
| Ag 25 | 1.27 | 1.39 | 0.71 |

The present invention has been described above by way of embodiments, and an effect of the present invention has been shown above by listing comparative examples; provided that the present invention is not limited to the above embodiments.

Requested characteristics of an organic light-emitting device are not limited to a luminous efficiency, and cover a broad spectrum including a color purity, a view angle characteristic, a white balance, and robustness at the time of the production of the device. The essence of the present invention is to adjust the intensity of resonance in each organic light-emitting element with a view to optimizing values for those many characteristics.

An exemplary embodiment of the present invention is as follows: in order that a color reproduction range of 100% may be secured in an NTSC mode, resonance is intensified to a larger extent in an organic light-emitting element the color purity of which deviates from an NTSC color purity to a larger extent.

Although a constitution in which an anode is placed on a TFT side has been described, the present invention can be carried out in a constitution in which a cathode is placed on a TFT side. Further, the present invention can be carried out even in a bottom emission type constitution in which a semi-transparent electrode, an organic compound layer, and a reflecting electrode are stacked on a transparent substrate, and a constitution in which the present invention can be carried out is not particularly limited. Although the protective layer is inserted in each of all the foregoing embodiments, the present invention is valid even in the absence of the protective layer.

In addition, the present invention is valid in such a constitution that both a cathode and an anode are each formed of a semi-transparent electrode, and emitted light is extracted from each surface of each of the electrodes. Further, the present invention can be carried out in a multiphoton constitution or multistage laminated constitution in which a plurality of organic light-emitting elements are stacked. Description has been made while a hole injection layer (HIL) has been omitted; the present invention is of course valid even when an HIL layer is provided.

A large number of electrode constitutions including a semi-transparent electrode constitution formed only of a semi-transparent layer, a semi-transparent electrode constitution formed by laminating a semi-transparent layer and a transparent conductive layer, and a semi-transparent electrode constitution formed by laminating metal thin films made of different materials are available for an electrode constitution on a light extraction side; the present invention is valid irrespective of an electrode constitution. In addition, a semi-transparent layer having a thickness of 30 nm or less is desirable from the viewpoint of a view angle characteristic upon application of the layer to an organic light-emitting device. A thickness from the lower surface of the anode of an organic light-emitting element to the upper surface of the cathode of the element is desirably 70 nm or more from the viewpoints of the securement of the internal quantum efficiency of the organic light-emitting device and the suppression of a short circuit or of current leakage.

Further, the present invention is applicable to each of an active matrix driven organic light-emitting device and a passive matrix driven organic light-emitting device.

Although a constitution in which all organic light-emitting elements each have a micro cavity structure has been described, a constitution in which micro cavity structures are provided for part of organic light-emitting elements is also permitted.

Hereinafter, the present invention will be specifically described by way of examples.

EXAMPLE 1

An organic light-emitting device provided with organic light-emitting elements showing three emission colors, that is, R, G and B colors is produced by the following method.

A planarizing film (not shown) provided with a contact hole is formed on the substrate 1 on which a TFT driver circuit is formed. A silver alloy is sputtered and patterned to form the metal layer 2a having a thickness of 100 nm on the formed planarizing film. Next, IZO is sputtered and patterned to form the transparent conductive metal oxide layer 2b having a thickness of 20 nm, whereby the anode 2 is formed. Further, an element isolation film (not shown) is formed of an acrylic resin, whereby a substrate with the anode is produced. The resultant is subjected to ultrasonic cleaning with isopropyl alcohol (IPA). Next, the resultant is subjected to boil washing and dried. Then, the resultant is subjected to UV/ozone cleaning before an organic compound layer is formed by vacuum vapor deposition.

The hole transport layers 3 of all organic light-emitting elements are sequentially formed of a compound represented by Chemical Formula 5 shown below by using a shadow mask. The thickness of the hole transport layer 3R of an organic R light-emitting element is 30 nm. The thickness of the hole transport layer 3G of an organic G light-emitting element is 25 nm. The thickness of the hole transport layer 3B of an organic B light-emitting element is 10 nm. Each layer is formed at a degree of vacuum of $1 \times 10^{-4}$ Pa and a deposition rate of 0.2 nm/sec.

Chemical Formula 5:

The respective light-emitting layers 4R, 4G and 4B are formed by using a shadow mask.

Alq3 as a host and a luminescent compound DCM [4-(dicyanomethylene)-2-methyl-6(p-dimethylaminostyryl)-4H-pyran] are co-deposited (at a weight ratio of 99:1), whereby the light-emitting layer 4R having a thickness of 45 nm is provided as a red light-emitting layer. Alq3 as a host and a luminescent compound coumarin 6 are co-deposited (at a weight ratio of 99:1), whereby the light-emitting layer 4G having a thickness of 25 nm is provided as a green light-emitting layer. A compound represented by Chemical Formula 6 shown below as a host and a compound represented by Chemical Formula 7 shown below are co-deposited from the vapor (at a weight ratio of 80:20), whereby the light-emitting layer 4B having a thickness of 15 nm is provided as a blue light-emitting layer. Each layer is formed at a degree of vacuum at the time of the vapor deposition of $1 \times 10^{-4}$ Pa and a deposition rate of 0.2 nm/sec.

Chemical Formula 6:

Chemical Formula 7:

Bathophenathroline (Bphen) is formed into a film having a thickness of 10 nm by the vacuum deposition method, which serves as the electron transport layers 5R, 5G and 5B. The layer is formed at a degree of vacuum at the time of the vapor deposition of $1.0 \times 10^{-4}$ Pa and a film formation rate of 0.2 nm/sec.

Bphen and $Cs_2CO_3$ are co-deposited (at a weight ratio of 90:10), whereby an electron injection layer (not shown) having a thickness of 10 nm is formed. The layer is formed at the degree of vacuum at the time of the vapor deposition of $3 \times 10^{-4}$ Pa and a deposition rate of 0.2 nm/sec.

The semi-transparent layers 7 of cathodes are sequentially formed of silver (Ag) by using a shadow mask. The thickness of the semi-transparent layer 7R of the organic R light-emitting element is 30 nm. The thickness of the semi-transparent layer 7G of the organic G light-emitting element is 25 nm. The thickness of the semi-transparent layer 7B of the organic B light-emitting element is 15 nm. Each layer is formed at a degree of vacuum at the time of the vapor deposition of $1 \times 10^{-4}$ Pa and a deposition rate of 0.2 nm/sec.

Then, the resultant is transferred to a sputtering apparatus while the degree of vacuum is maintained. A transparent conductive layer of IZO is formed in a thickness of 60 nm to serve as any one of the transparent conductive layers 11R, 11G, and 11B in the cathodes. Further, a film of silicon oxynitride is formed in a thickness of 700 nm to serve as each of the protective layers 8.

After the formation of the protective layers 8, the substrate is taken out of the sputtering device. An acrylic resin layer having a thickness of 500 μm (not shown) is stuck onto each of the protective layers 8, and, further, a glass plate having a thickness of 700 μm (not shown) is stuck onto the resin layer, whereby an organic light-emitting device is obtained.

In this example, the thickness of the semi-transparent layer 7 of an organic light-emitting element is different from the thickness of the semi-transparent layer 7 of any other organic light-emitting element, whereby an optimum micro cavity structure can be established in each organic light-emitting element. As a result, an improvement in luminous efficiency of an organic light-emitting element, and an increase in lifetime of the element can be achieved.

EXAMPLE 2

Details about this example are omitted because this example is the same as Example 1 except that the thickness of the semi-transparent layer 7R of the R light-emitting element and the thickness of the hole transport layer 3R of the R light-emitting element are changed to 20 nm and 25 nm, respectively.

EXAMPLE 3

In this example, an organic light-emitting device is produced in the same manner as in Example 1 except that: a material for, and the thickness of, each of the semi-transparent layers 7 are changed; and the thickness of each of a hole transport layer and a light-emitting layer is individually optimized for each organic light-emitting element.

The hole transport layers 3 of all organic light-emitting elements are sequentially formed of the same material as that used in Example 1 by using a shadow mask. The thickness of the hole transport layer 3R of an organic R light-emitting element is 25 nm. The thickness of the hole transport layer 3G of an organic G light-emitting element is 20 nm. The thickness of the hole transport layer 3B of an organic B light-emitting element is 20 nm.

The light-emitting layers 4 of all organic light-emitting elements are sequentially formed of the same material as that used in Example 1 by using a shadow mask. The thickness of the light-emitting layer 4R of the organic R light-emitting element is 45 nm. The thickness of the light-emitting layer 4G of the organic G light-emitting element is 25 nm. The thickness of the light-emitting layer 4B of the organic B light-emitting element is 20 nm.

The semi-transparent layers 7R and 7G are sequentially formed of silver (Ag) by using a shadow mask, and the semi-transparent layer 7B is formed of aluminum by using a shadow mask. The semi-transparent layers of all organic light-emitting elements have an equal thickness of 10 nm.

In this example, aluminum was used as a material for the semi-transparent layer of only the organic B light-emitting element so that the thickness of the organic compound layer 6B was increased. The thickness of the organic compound layer 6B can be made larger than that in a conventional constitution by reason of a difference in phase shift between silver and aluminum. Increasing the thickness of each of a hole transport layer and a light-emitting layer as compared to that in the case where silver used as a material for a semi-transparent layer has an improving effect on the internal quantum efficiency of the organic light-emitting device and a lengthening effect on the lifetime of the organic light-emitting device.

EXAMPLE 4

In this example, an organic light-emitting device is produced in the same manner as in Example 1 except that: the thickness of the semi-transparent layer of an organic B light-emitting element is changed; and the thickness of each of the hole transport layer 3B and light-emitting layer 4B of the organic B light-emitting element is optimized.

The hole transport layers 3 of all organic light-emitting elements are sequentially formed of the same material as that used in Example 1 by using a shadow mask. The thickness of the hole transport layer 3R of an organic R light-emitting element is 30 nm. The thickness of the hole transport layer 3G of an organic G light-emitting element is 20 nm. The thickness of the hole transport layer 3B of an organic B light-emitting element is 20 nm.

The light-emitting layers 4 of all organic light-emitting elements are sequentially formed of the same material as that used in Example 1 by using a shadow mask. The thickness of the light-emitting layer 4R of the organic R light-emitting element is 45 nm. The thickness of the light-emitting layer 4G of the organic G light-emitting element is 25 nm. The thickness of the light-emitting layer 4B of the organic B light-emitting element is 20 nm.

The semi-transparent layers 7R and 7G are sequentially formed of a silver film having a thickness of 25 nm by using a shadow mask, and the semi-transparent layer 7B is formed of a silver film having a thickness of 15 nm by using a shadow mask.

In this embodiment, the thickness of the organic B light-emitting element is reduced as compared to that of any other organic light-emitting element in order that the luminous efficiency of the organic B light-emitting element, which is low, may be improved, whereby an organic light-emitting device in which the respective organic light-emitting elements have a uniform, high luminous efficiency can be obtained.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

What is claimed is:

1. An organic light-emitting device comprising a plurality of organic light-emitting elements including an organic light-emitting element showing a first emission color and at least one organic light-emitting element showing a different emission color from the first emission color, each of the organic light-emitting elements comprising:
   a first electrode having a reflective surface;
   a second electrode placed on a light extraction side and including a semi-transparent layer;
   an organic compound layer including a light-emitting layer and formed between the first electrode and the second electrode; and
   a micro cavity structure for resonating light emitted from the light-emitting layer between the reflective surface and the semi-transparent layer,
   wherein a material of the semi-transparent layer in the organic light-emitting element showing the first emission color is different from a material of the semi-transparent layer in the at least one organic light-emitting element showing the different emission color.

2. The organic light-emitting device according to claim 1, wherein a color difference between chromaticity observed from a front surface and chromaticity observed from an arbitrary angle of 45° or less with respect to the front surface satisfies the following Equation 1:

$$\Delta u'v' < 0.025 \qquad \text{Equation 1}$$

where $\Delta u'v'$ represents a distance between chromaticity coordinates observed from the front surface and chromaticity coordinates observed from an arbitrary angle of 45° or less with respect to the front surface in a u'v' chromaticity diagram.

3. The organic light-emitting device according to claim 1, wherein the organic light-emitting element showing the first emission color is an organic light-emitting element having lowest luminous efficiency.

4. The organic light-emitting device according to claim 1, wherein the second electrode has a transparent conductive layer.

5. The organic light-emitting device according to claim 1, wherein the semi-transparent layer has a larger thickness in the organic light-emitting element having a larger emission wavelength.

6. The organic light-emitting device according to claim 1, wherein the plurality of organic light-emitting devices includes a red-light-emitting organic light-emitting device, a green-light-emitting organic light-emitting device, and a blue-light-emitting organic light-emitting device, and a material of a semi-transparent layer of the blue-light-emitting organic light-emitting device is different from that of the red-light-emitting organic light-emitting device and that of the green-light-emitting organic light-emitting device.

* * * * *